United States Patent [19]
Palagonia

[11] Patent Number: 5,907,785
[45] Date of Patent: May 25, 1999

[54] WAFER WITH ELEVATED CONTACT SUBSTRUCTURES

[75] Inventor: Anthony Michael Palagonia, Underhill, Vt.

[73] Assignee: International Business Machines Corporation, Armonk, N.Y.

[21] Appl. No.: 08/826,362

[22] Filed: Mar. 26, 1997

Related U.S. Application Data

[62] Division of application No. 08/518,740, Aug. 24, 1995, Pat. No. 5,874,782.

[51] Int. Cl.$^6$ .................................................. H01L 21/44
[52] U.S. Cl. ......................... 438/613; 438/612; 438/615; 438/118
[58] Field of Search ................................. 438/613, 118, 438/612, 615

[56] References Cited

U.S. PATENT DOCUMENTS

| | | | |
|---|---|---|---|
| 4,172,907 | 10/1979 | Mones et al. | 438/613 |
| 4,346,124 | 8/1982 | Wood et al. | 438/118 |
| 4,545,610 | 10/1985 | Lakritz et al. | 438/615 |
| 4,647,959 | 3/1987 | Smith | 438/118 |
| 4,948,754 | 8/1990 | Kondo et al. | 438/613 |
| 5,034,345 | 7/1991 | Shirahata | 438/613 |
| 5,162,257 | 11/1992 | Yung | 438/613 |
| 5,286,679 | 2/1994 | Farnworth et al. | 438/118 |
| 5,393,696 | 2/1995 | Koh et al. | 438/613 |
| 5,424,245 | 6/1995 | Gurtler et al. | 438/613 |
| 5,527,734 | 6/1996 | Van Der Putten | 438/613 |
| 5,587,337 | 12/1996 | Idaka et al. | 438/613 |
| 5,707,962 | 1/1998 | Chang et al. | 438/613 |

*Primary Examiner*—Kevin M. Picardat
*Assistant Examiner*—Deven Collins
*Attorney, Agent, or Firm*—Robert A. Walsh, Esq.

[57] ABSTRACT

Disclosed is a semiconductor wafer, and the method of making the same, the wafer being formed to have a multiplicity of raised contact pads on its surface. The contact pads are formed with conductors which are disposed on the surface of the wafer and which are coupled to internal circuitry embedded in the wafer rough vias in the wafers surface. The contact pads are in a raised elevational relationship relative to the surface conductors. After the wafer is fully processed, by dicing individual integrated circuit chips out of the wafer, each chip can then be mounted on a higher level of assembly, such as a printed circuit board. The raised contact pads originally formed on the wafer, and therefore formed on each individual chip, provide the contact points by which the chip can be bonded with matingly arranged contact pads on the higher level of assembly.

3 Claims, 4 Drawing Sheets

WAFER WITH ELEVATED CONTACT SUBSTRUCTURES

This application is a division of application Ser. No. 08/518,740 filed Aug. 24, 1995 which application is now U.S. Pat. No. 5,874,782.

FIELD OF THE INVENTION

The present invention relates to a semiconductor wafer that is formed to have elevated contact structures for mounting chips, which are diced out of the wafer, to a higher level of assembly, by using the elevated contact structures as the points for physical and electrical connection.

BACKGROUND OF THE INVENTION

There are a number of methods by which integrated circuit chips may be mounted on a higher level of assembly, such as a printed circuit board. For example, one such technique generally known as "A-wire" or "lead on chip" (LOC) involves placing the chip inside a plastic package and coupling certain contact points on the chip with somewhat rigid conductive leads by means of a thin wire bond. The leads are then bonded to corresponding contact pads on a printed circuit board, which thereby enables the chip to communicate with the board. In an alternative packaging scheme, generally referred to as "tape automated bonding" (TAB) the chip is mounted on a tape which is configured to also have a series of conductive leads, albeit somewhat flexible ones, which are used to make contact with conductive points around the periphery of the chip. The end of the lead opposite to the connection with the chip is then used to make contact with the higher level of assembly, which again may be a printed circuit board. In both LOC and TAB the leads establish the electrical paths by which the chip is accessed for signal transmission, as well as for providing power and ground.

With regard to LOC and TAB, both such techniques generally require the higher level of assembly, such as a printed circuit board, to have a place for mounting the chip package which is larger than the chip itself. Since in both instances the chip, either by itself or when surrounded by a plastic package, will have the leads extend out from its periphery, the finished chip package will make a so-called "footprint" on the higher level of assembly that is necessarily larger than the chip itself. A further limitation of the TAB method of packaging in particular, is that TAB has been used for making connection with chip contact pads that are positioned around the periperhy of the chip, but not contact pads disposed in the central region of the chip. Many modern chips are now designed with their contact points in the center, as that particular arrangement tends to reduce the noise which may effect the operation of the electrical circuits contained within. TAB, therefore, is not well suited for use with chips configured with their contact points centrally located.

Still another method of mounting a chip on a higher level of assembly, is the so-called "C4" technique, which generally involves creating a plurality of dome-like solder balls on one side of the chip. The C4 balls are the connection points by which the chip is accessed for sign transmission, as well as for providing power and ground. One of the limitations of C4 technology, however, is that power and ground signs or the circuits located in a given portion of the chip are provided through localized C4 connections. In other words, circuits in one region of the chip will be serviced by one set of C4 balls carrying power and ground, while circuits in a second region will be serviced by another set of C4 balls carrying power and ground, and so on for all of the circuits on the chip. As a result, chips having C4 connections tend to have a large number of power and ground C4 balls, which are in addition to the multiplicity of C4 balls that are needed for signal connections. Accordingly, due to the inherent spacing limitations of the chip's side, designing a chip for connection to a higher level of assembly through C4 balls can be problematic.

SUMMARY OF THE INVENTION

It is, therefore, an object of the present invention is to provide a chip connection technique which provides as small a chip footprint on the higher level of assembly as is possible.

Another object of the present invention is to provide a chip connection system which includes as few as one power and one ground bus on the chip itself.

Yet another object of the present invention is to provide a chip connection technique that can be implemented using existing semiconductor wafer processing techniques so that the invention can be implemented in a cost efficient manner.

In its preferred embodiment, the invention relates to a semiconductor wafer that has raised contact pads that are formed at the wafer level. The contact pads are the conductive elements by which chips, which are eventually diced out of the wafer, can be mounted onto a higher level of assembly, such as a printed circuit board. Since the raised contact pads are actually formed at the wafer level, existing methods of performing photolithography on semiconductor substrates may be used to create the elevated structures. Additionally, such photolithography can be used to create interconnect wiring and power and ground buses on the surface of the wafer. Wafers processed using this particular technique can then be diced into individual chips, and the chips will be suitable for mounting on a higher level of assembly without any additional chip packaging. Because the chip requires no additional packaging and because all the connections between the chip and the higher level of assembly are contained within the perimeter established by the sides of the chip, chips made using the technique can be packed quite densely on the higher level of assembly since each chip's footprint is no larger than the chip itself.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompany drawings, wherein:

DETAILED DESCRIPTION OF THE INVENTION

Figure 1A:
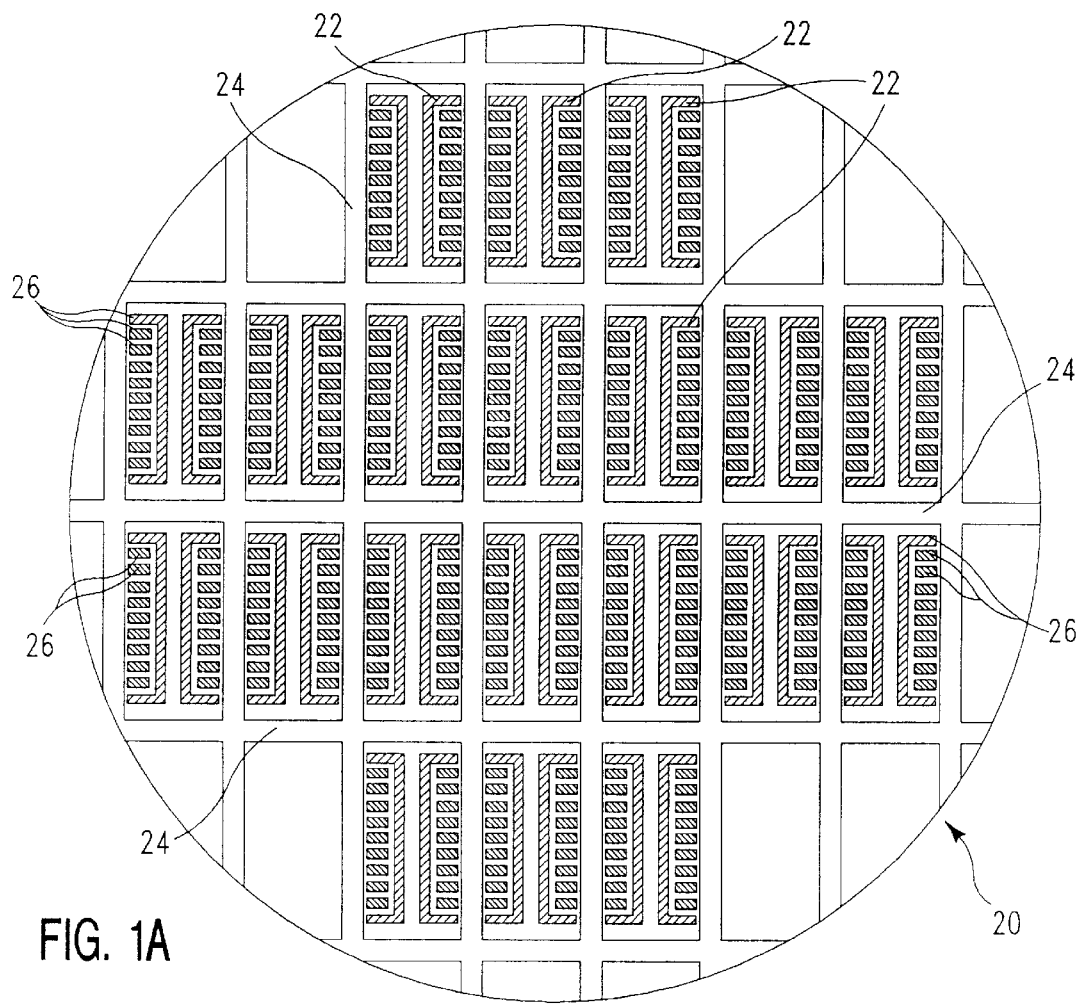
FIG. 1A is top view of a wafer, processed in accordance with the preferred embodiment of the present invention, the wafer being shown to include a multiplicity of integrated circuit chips.
Figure 1B:
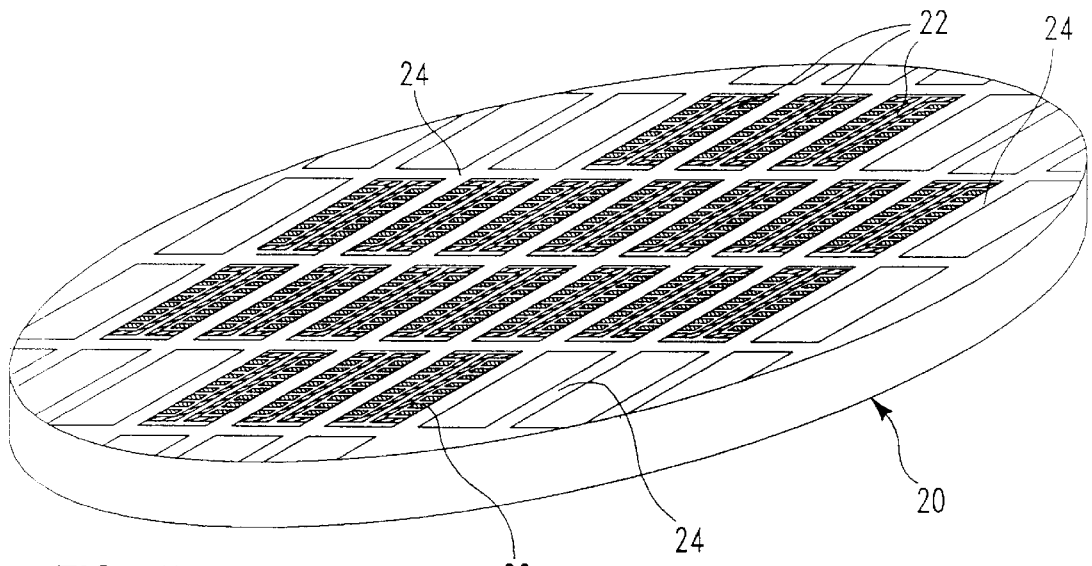
FIG. 1B is an isometric view of the wafer of FIG. 1A.

In accordance with the preferred embodiment of the present invention, FIGS. 1A and 1B provide, respectively, a top view and isometric view of wafer 20. Wafer 20 is principally made up of a semiconductor substrate material, such as silicon, which is processed with conductive and insulative materials to form integrated circuits embedded within the substrate. Typically a complete, integrated circuit pattern will be replicated a number of times on wafer 20 so that, after processing is completed, wafer 20 is formed to contain a plurality of discrete, individual chips 22 which are substantially identical to one another. As shown on FIGS. 1A and 1B, each discrete chip 22 is separated from any adjoining chip 22 on wafer 20 by kerf regions 24. Kerf regions 24 not only define the boundaries of chips 22 on wafer 20, but at later stages of wafer 20 processing, wafer 20 will be "diced" along the kerf regions 24 to separate the individual chips 22 into the integrated circuit chips that are used as the building blocks of many electronic systems. Although wafers processed in accordance with the preferred embodiment of the invention are eventually diced into individual chips, it is important to note that the processing steps and the resulting structure discussed in this detailed description are carried out at the wafer level, meaning before the wafer 20 is diced into individual chips 22.

As best seen by reference to FIG. 1A, the surface of each individual chip 22 contains a plurality of conductors 26 which, as will be detected below, are used for the purpose of connecting any given chip 22 to the next higher level of assembly after hips 22 are diced out of wafer 20. Further details relating to conductors 26, the process by which they are formed, and the manner by which they can be used to connect chip 22 to the next higher level of assembly are provided in connection with the discussion of FIGS. 2–5.

Figure 2:
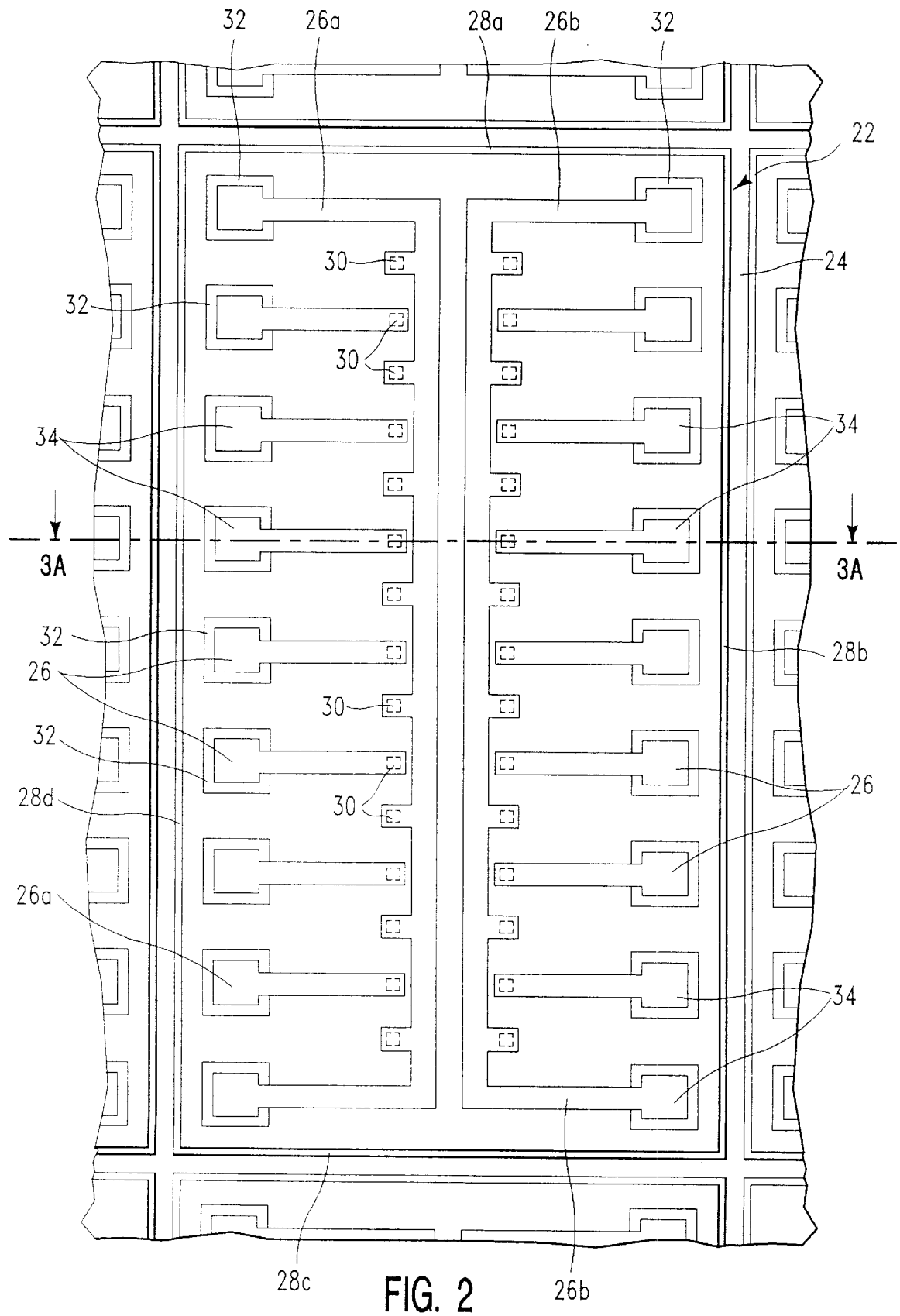
FIG. 2 is a top view of one of the chips (including partial adjoining chips) of the wafer shown in FIGS. 1A and 1B.

Referring now to FIG. 2, an enlarged, top view of chip 22 is given to provide enhanced detail of conductors 26 shown in FIGS. 1A and 1B. As can be seen in the greater detail of the enlarged illustration, the top surface of chip 22 includes a plurality of conductors 26. In accordance with the present invention, conductors 26 are formed during wafer processing by depositing the metallurgy that forms conductors 26 in a manner similar to the metal deposition steps used to form the internal circuitry of chip 22. That is to say, photolithographic techniques that are available for the creation of the internal circuitry and wiring patterns in a chip (ie. the processes of material deposition, mask exposure, and etch) can also be used to form conductors 26 on the surface of wafer 20, and thereby on the surface of each chip 22 which will be diced out of wafer 20. Of course, conductors 26 may be far thicker and wider than wiring that interconnects the circuit elements embedded within the chip 22; nonetheless, such greater dimensions may be accomplished through the appropriate adjustments and variations of the photolithographic process. Although many different conductive materials may be used to form conductors 26, in the preferred embodiment, conductors 26 are made of plated copper.

Still referring to FIG. 2, one end of each conductor 26 is shown to be deposited in a via 30; however, vias 30 are not directly visible in the top down view of FIG. 2 and are therefore shown in dashed lines. As will be further detailed in connection with the discussion of FIG. 3, each such via 30 opens to a via contact (shown as reference number 40 in FIG. 3). Via contact 40 is coupled to the internal circuitry of chip 22, such that each via 30 provides an opening through which conductors 26 on the surface of a given chip 22 may make physical connection with the internal circuitry of that chip 22.

Figure 3B:
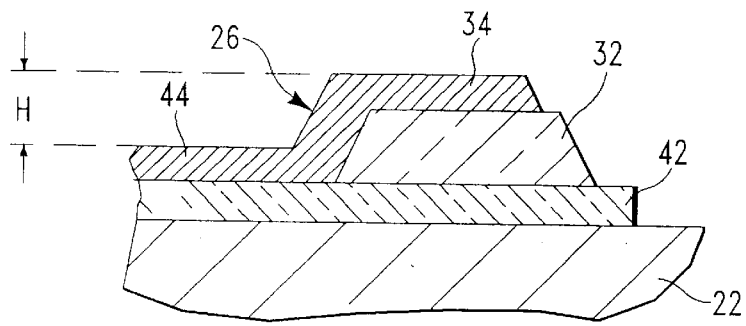
FIG. 3B is an enlarged view of a portion of the chip shown in FIG. 3A.
Figure 3A:
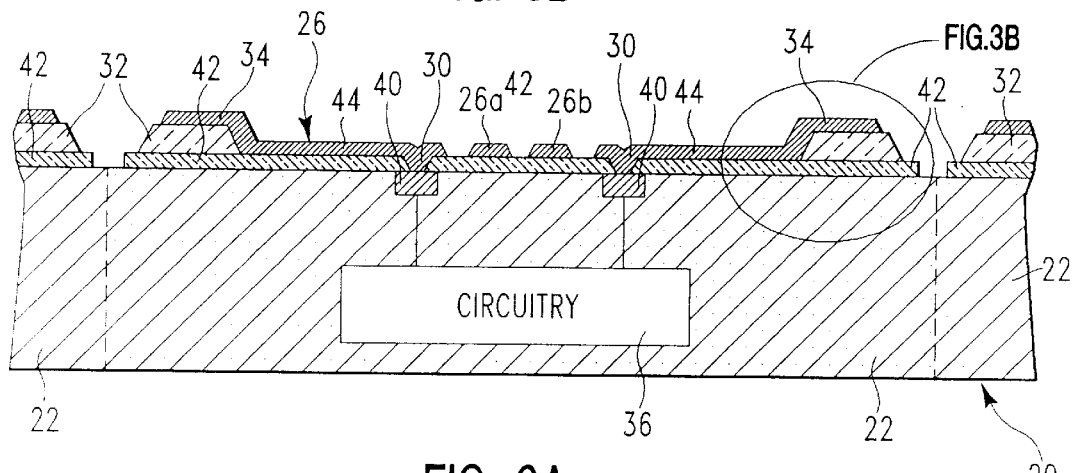
FIG. 3A is a side, sectioned view of the chip shown in FIG. 2, as such chip is shown in FIG. 2 to be sectioned along the line 3A—3A.
Figure 5:
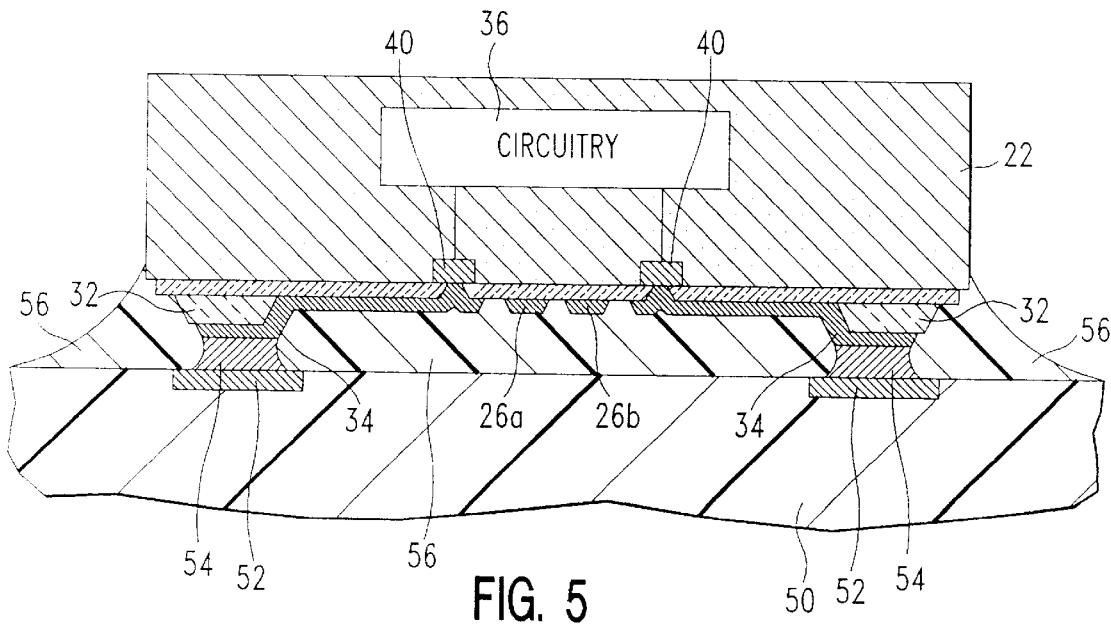
FIG. 5 is a side sectioned view of a the chip of FIGS. 1–4 mounted on a printed circuit board.

Also shown on FIG. 2 is raised bump 32, the elevation of which is not visible in the top view of FIG. 2, but is visible in the side sectioned view of FIGS. 3–5. Additionally, each bump 32 is only partially visible in the top view of FIG. 2 because contact pad 34 is formed over the top of bump 32 which is also shown in FIGS. 3–5. As will also be detailed in connection with the discussion of FIGS. 3A and 3B, bump 32 provides a raised landing area which is elevated above the plane defined by the portion of conductors 26 disposed directly on the top surface of wafer 20. It can also be seen from the top view of chip 22 provided in FIG. 2 that each contact pad 34 of each conductor 26 is formed such that it is spaced back from the perimeter defined by the four sides 28a, 28b, 28c, 28d of the given chip 22 on which it is placed. Given that all contact pads 34 are contained within the perimeter defined by the four sides 28a, 28b, 28c, 28d of chip 22, chip 22 may be mounted side by side with other chips 22 on a printed circuit board, for example, for a very densely packed mounting arrangement.

From the detail of FIG. 2, it can be seen that two of the conductors on the top surface of chip 22 run its entire length, and thereby run in close proximity to vias 30 which are centrally disposed on chip 22. In the preferred embodiment, conductor 26a is a power distribution bus, and conductor 26b is a ground bus. As such, chip 22 includes one single power bus and one single ground bus servicing the entire chip. Moreover, conductor 26a and 26b each have only two contact pads 34 on either end of the respective conductive strips forming the buses, which considerably reduces the number of contact pads 34 needed to provide power and ground service to all of the circuitry embedded within chip 22.

Referring now to FIG. 3A, a side, sectioned view of chip 22 (including partial views of adjoining chips 22), as sectioned along the line 3A—3A shown in FIG. 2, is provided. With regard to FIG. 3A (and also FIGS. 4A–4D below) it should be noted at a vertical dashed line has been provided to assist in distinguishing one complete chip 22 from the partial chips 22 beside it. As indicated above, however, it should be understood that because the processing steps detailed herein are performed before the wafer is diced into individual chips, the dashed line should not be interpreted to suggest that the wafer is divided in FIG. 3A.

As stated above, chip 22 is made up of a semiconductor substrate, which in the preferred embodiment is silicon, and is shown to include circuitry 36. In FIGS. 3–5 circuitry 36 is simply shown in logic block form because its actual design may vary widely based on the function of chip 22, and its full detailed illustration is not essential to the description of the present invention. Near the upper surface of chip 22 is via contact 40 which is a metallurgical (or other conductive) structure that is electrically coupled to circuitry 36. An insulator coating 42, such as a relatively thick layer of polymide or other suitable insulator material, is layered over the surface of wafer 20. Via 30 (two of which are shown in FIG. 3A) is formed by an opening in insulator coating 42, which thereby provides access to via contact 40. In the preferred embodiment, via contact 40 is physically and electrically coupled with conductor 26 through its corresponding via 30 so that each such conductor 26 may carry electrical signals between circuitry 40 of chip 22 and another electrical component, such as a printed circuit board to which chip 22 may be eventually attached.

Also as seen in the side sectioned view of FIG. 3A, disposed on the surface of insulator coating 42 is bump 32, which is raised in elevation relative to the plane defined by the portion of conductors 26 disposed directly on the top surface of wafer 20. In the preferred embodiment, bump 32 is made of a relatively thick layer of insulation material, which could also be polymide. It should be noted, however, that because bump 32 is electrically isolated from the substrate of wafer 20 by insulator coating 42, in other embodiments of the invention bump 32 may also be made of a conductive material, such as plated copper. In yet other embodiments of the invention, bump 32 may actually be stamped from a material and then adhesively mounted onto the surface of wafer 40, instead of being formed by the process of photolithography. In short, the actual material composition and method of formation of bump 32 can vary, provided bump 32 creates an elevational structure that is raised relative to surface conductor 44.

Still referring to FIG. 3A, conductor 26 includes space conductor 44, which is the portion of conductor 26 that runs on top of the major, horizontal surface of insulator coating 42 and therefore the top, major, horizontal surface of wafer 20. As shown in FIG. 3A, one end of surface conductor 44 is formed to fill the opening of via 30, and thereby makes physical and electrical contact with via contact 40. Conductor 26 further includes contact pad 34, which is generally at the end opposite to the connection with via contact 40. Given that contact pad 40 is disposed over bump 32, it is also in a raised elevational position relative to the plane defined by surface conductor 44.

Referring now to FIG. 3B, an enlarged view of a portion of conductor 26, as shown in FIG. 3A, is provided. As can be seen through the enhanced detail, the top surface of surface conductor 44 defines a plane (represented by the lower dashed line), which is separated by a height (H) from the plane (represented by the upper dashed fine) defined by the top surface of contact pad 34. It will be understood that although only a segment of one conductor 26 is shown in FIG. 3A, the planes defined by the one surface conductor 44 and the one contact pad 34 shown in FIG. 3A are generally the same planes defined by the other surface conductors 44 and contact pads 34 on wafer 20.

Figure 4A:
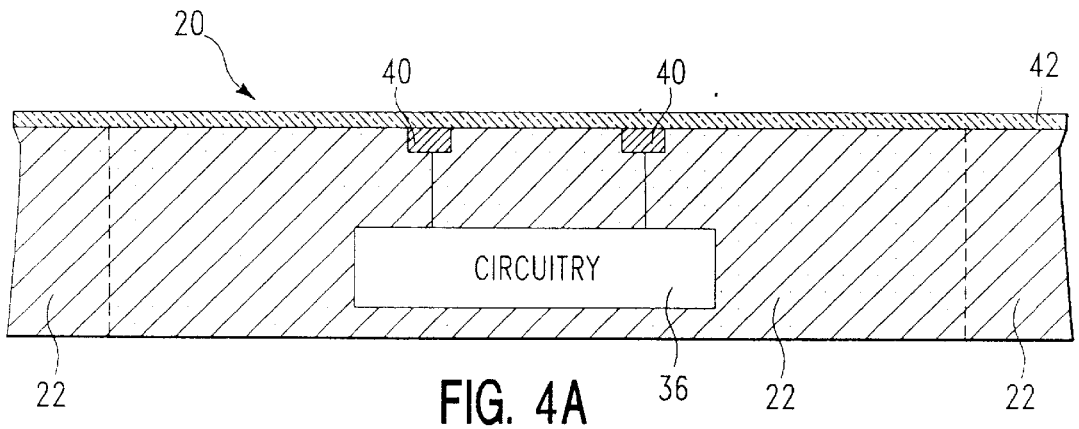
FIGS. 4A–4D are a series of drawings which illustrate the process steps by which the wafer, and therefore chips, of FIGS. 1–3 are processed.

Referring now to FIGS. 4A–4D, a series of drawings are provided to illustrate the process by which the structure of the preferred embodiment of the invention is formed. In FIG. 4A wafer 20 is shown to be formed with circuitry 36, which can be designed to accomplish a very wide variety of functions. Via contacts 40, which are electrically connected to circuitry 36, as detailed above, are shown to be near the upper surface of the wafer 20, but are actually covered by insulator coating 42. During the initial process steps, insulator coating 42 is patterned to form the openings which will eventually become vias 30, and then insulator coating 42 is cured.

Figure 4B:
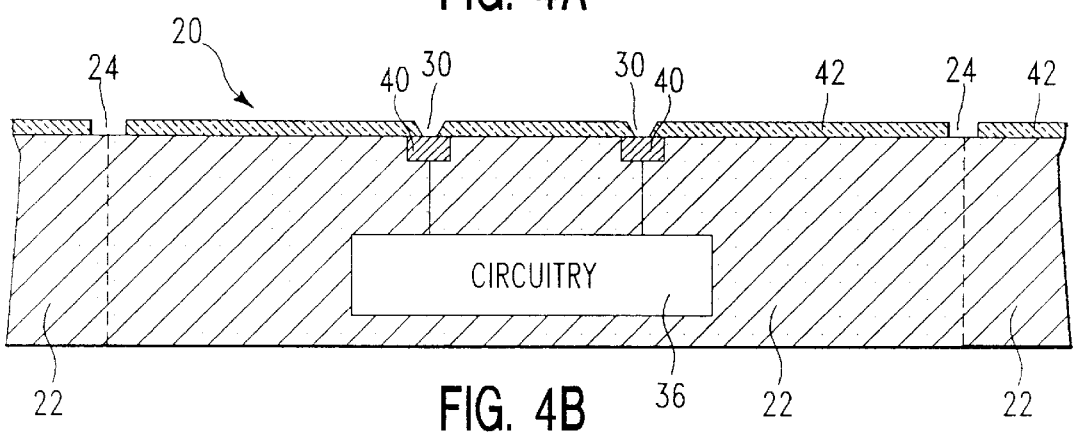
Figure 4C:
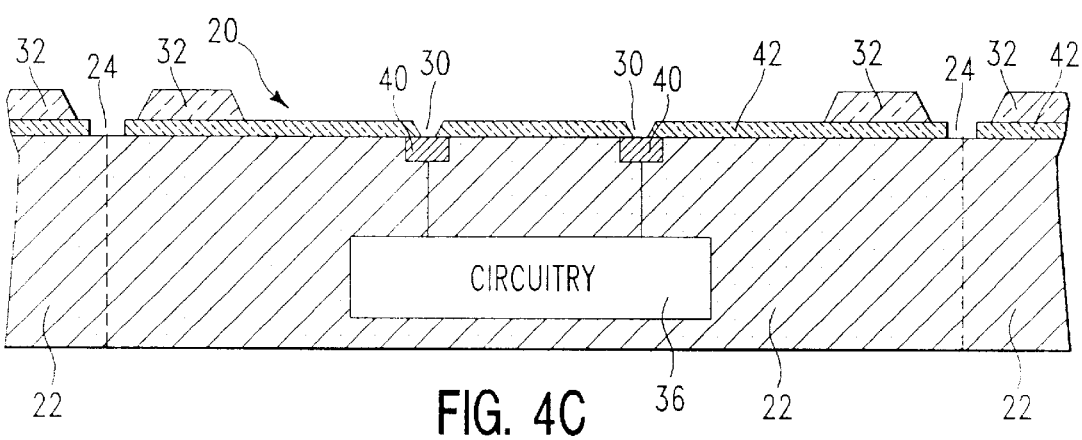

FIG. 4B shows the results of an etch process step whereby vias 30 are created in insulator coating 42 to expose via contacts 40, and also insulator coating 42 is removed in the kerf regions 24 separating adjoining chips 22. FIG. 4C is next processed to create bump 32, which as discussed above, can be accomplished through photolithography, or stamping, and adhesive attachment. In the embodiment shown in FIG. 4C, bump 32 is shown to be deposited through a polyimide deposition, cure, and etch process, similar to the processing of insulator coating 42.

Figure 4D:
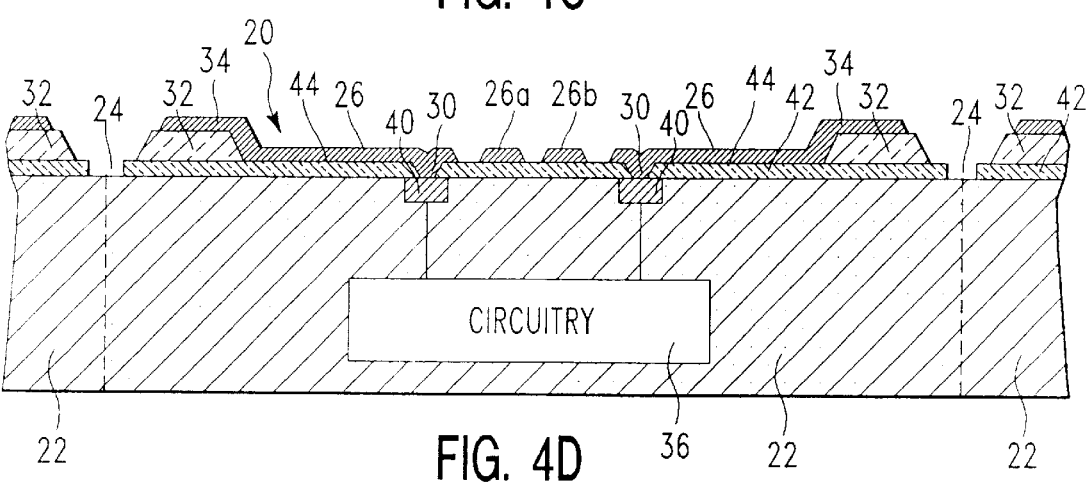

After the formation of bump 32, wafer 20 is next coated with a blanket deposit of a thin conductor, which is then patterned in accordance with the form of the permanent conductors 26. Then the wafer is electroplated with copper, the resist is stripped, and an etch step is performed to expose the thin conductor. The resulting structure is shown in FIG. 4D, from which it will be seen that conductors 26 (including conductors 26a and 26b) have been formed over the surface of insulator coating 42 and bump 32, and surface conductor 44 is deposited in via 30 in contact with via contact 40.

Given that the processing steps discussed in connection with FIGS. 4A–4D occur before wafer 20 is diced into individual chips 22, wafer 20 has on its surface a plurality surface conductors 44, which may run in any desired pattern and a plurality of conductive raised elevational structures, namely contact pads 34 disposed on the tops of bumps 32. Although the act elevation of such contact pads 34 may vary, it will be understood that the elevation should be great enough so that if, after dicing, chip 22 is mounted on a higher level of assembly, contact pads 34 could make contact with the surface of the higher level of assembly without having surface conductors 44 or any other part of chip 22 simultaneously make such contact. Greater particulars on this feature are discussed in connection with FIG. 5.

Referring now to FIG. 5, chip 22 of FIGS. 1–4 is shown to be separated from the other chips 22 on wafer 20. Additionlly, in this particular illustration, chip 22 has been flipped upside-down (relative to the other Figures), and it has been mounted on printed circuit board 50, which is shown in partial side sectioned view. Board 50 could be made of a rigid fiberglass, or a flexible polyimide, while in yet other embodiments, chip 22 may be mounted on other types of higher levels of assembly, such as ceramic boards or multichip modules. In the preferred embodiment, board 50 is shown to include two board contacts 52 which are matingly adapted for connection with contact pads 34. In the particular embodiment shown, an intermediate conductor 54, such as a tin/lead solder, is used to bond contact pads 34 of chip 22 to their respective board contacts 54. Additionally, in the particular embodiment shown, the space between the top side of board and the bottom side of chip 22 is filled with an insulative epoxy 56.

From FIG. 5, it can now be appreciated that due to the elevated structure of each contact pad 34, chip 22 can be mounted on a printed circuit board without having surface conductor 44 or any other part of chip 22 make contact with the board, which might cause electrical shorting. Additionally, it can now be appreciated that the preferred embodiment of the invention affords an economical and simplified process by which integrated circuit chips 22 can be mounted to boards or other higher levels of assembly. Depending upon the locations of board contacts 52 with which chip 22 must be mated, during wafer 20 processing bumps 32 may be situated in widely varying patterns on chip 22, and the contact pads 34 which overlay bumps 32 may simply be connected to the appropriate via contacts 40 by means of the customized routing of surface conductor 44 on the surface of wafer 20. Yet another benefit is that chip 22 includes both power and ground buses on the chip itself, but only has two contact pads 34 for each. Finally, given that the particular conductive elements of chip 22 which make contact with the higher level of assembly, namely contact pads 34, are formed within the periphery of the chip 22 sides, chips made in this manner may be densely packed side by side on a given higher level of assembly because each one establishes a footprint which is no bigger than the chip itself.

Changes may be made to the above detailed process or structure without departing from the scope of the invention described herein. It is intended that all the mater contained in the above description or shown in the accompanying drawings shall be interpreted in an illustrative and not in a limiting sense. Thus, other alternatives and modifications will now become apparent to those skilled in the art without departing from the spirit and scope of the invention, as set forth in the following claims.

What is claimed is:

1. A method of processing a semiconductor wafer comprising the steps of:

depositing on a top surface of the wafer a surface conductor, such that the surface conductor is at a given elevation;

depositing on the top surface of the wafer a contact pad, such that the contact pad is coupled to the surface conductor and the contact pad is at an elevation that is different than the elevation of the surface conductor; and creating a bump of non-conductive material on the top surface of the wafer, such that the bump is adhesively mounted between the conductive pad and the top surface of the wafer.

2. The method as in claim 1 wherein the bump is created using a photolithographic process.

3. The method as in claim 1 further comprising the step of creating a via in the top surface of the wafer so that the surface conductor is coupled with circuitry embedded within the wafer during said surface conductor depositing step.

* * * * *